US008707239B2

(12) United States Patent  (10) Patent No.: US 8,707,239 B2
Waller  (45) Date of Patent: Apr. 22, 2014

(54) INTEGRATED CIRCUIT ROUTING WITH COMPACTION

(71) Applicant: Pulsic Limited, Bristol (GB)

(72) Inventor: Mark Waller, Bristol (GB)

(73) Assignee: Pulsic Limited (GB)

( * ) Notice: Subject to any disclaimer, the term of this patent is extended or adjusted under 35 U.S.C. 154(b) by 0 days.

(21) Appl. No.: 13/711,550

(22) Filed: Dec. 11, 2012

(65) Prior Publication Data

US 2013/0104095 A1    Apr. 25, 2013

Related U.S. Application Data

(60) Continuation of application No. 13/186,258, filed on Jul. 19, 2011, now Pat. No. 8,332,799, which is a continuation of application No. 12/552,183, filed on Sep. 1, 2009, now Pat. No. 7,984,411, which is a division of application No. 11/425,828, filed on Jun. 22, 2006, now Pat. No. 7,603,644.

(60) Provisional application No. 60/595,351, filed on Jun. 24, 2005.

(51) Int. Cl.
*G06F 17/50* (2006.01)

(52) U.S. Cl.
USPC ............................ 716/126; 716/129; 716/130

(58) Field of Classification Search
USPC .................................................. 716/126–130
See application file for complete search history.

(56) References Cited

U.S. PATENT DOCUMENTS

| 4,613,941 A | 9/1986 | Smith et al. |
| 4,615,011 A | 9/1986 | Linsker |
| 4,673,966 A | 6/1987 | Shimoyama |
| 4,777,606 A | 10/1988 | Fournier |
| 4,782,193 A | 11/1988 | Linsker |
| 4,811,237 A | 3/1989 | Putatunda et al. |
| 4,815,003 A | 3/1989 | Putatunda et al. |
| 4,835,705 A | 5/1989 | Fujino et al. |
| 4,855,253 A | 8/1989 | Weber |
| 4,965,739 A | 10/1990 | Ng |
| 5,047,949 A | 9/1991 | Yamaguchi |
| 5,072,402 A | 12/1991 | Ashtaputre et al. |
| 5,272,645 A | 12/1993 | Kawakami et al. |
| 5,353,235 A | 10/1994 | Do et al. |
| 5,375,069 A | 12/1994 | Satoh et al. |
| 5,500,804 A | 3/1996 | Honsinger et al. |
| 5,541,005 A | 7/1996 | Bezama et al. |

(Continued)

FOREIGN PATENT DOCUMENTS

WO    96/24904 A    8/1996

OTHER PUBLICATIONS

Finch, A.C., et al., "A Method for Gridless Routing of Printed Circuit Boards," IEEE, 22nd Design Automation Conference, 1985, pp. 509-515, Paper 32.2.

*Primary Examiner* — Suresh Memula
(74) *Attorney, Agent, or Firm* — Aka Chan LLP

(57) ABSTRACT

An iterative technique is used to automatically route nets and alter spacing of an integrated circuit design to achieve a fully routed and compact result. After identifying solid and hollow channels, the technique automatically places route paths to connect pins of cells in the solid channels, where route paths may be placed within the solid channels or hollow channels. The technique can reduce a width of at least one hollow channel when an entire space of the hollow channel is not occupied by a placed route path.

20 Claims, 3 Drawing Sheets

(56) References Cited

U.S. PATENT DOCUMENTS

| | | |
|---|---|---|
| 5,550,748 A | 8/1996 | Xiong |
| 5,635,736 A | 6/1997 | Funaki et al. |
| 5,637,920 A | 6/1997 | Loo |
| 5,640,327 A | 6/1997 | Ting |
| 5,646,830 A | 7/1997 | Nagano |
| 5,650,653 A | 7/1997 | Rostoker et al. |
| 5,689,433 A | 11/1997 | Edwards |
| 5,723,908 A | 3/1998 | Fuchida et al. |
| 5,757,089 A | 5/1998 | Ishizuka |
| 5,784,289 A | 7/1998 | Wang |
| 5,801,385 A | 9/1998 | Endo et al. |
| 5,801,959 A | 9/1998 | Ding et al. |
| 5,811,863 A | 9/1998 | Rostoker et al. |
| 5,822,214 A | 10/1998 | Rostoker et al. |
| 5,880,969 A | 3/1999 | Hama et al. |
| 5,889,329 A | 3/1999 | Rostoker et al. |
| 5,980,093 A | 11/1999 | Jones et al. |
| 6,111,756 A | 8/2000 | Moresco |
| 6,150,193 A | 11/2000 | Glenn |
| 6,219,823 B1 | 4/2001 | Hama et al. |
| 6,260,183 B1 | 7/2001 | Raspopovic et al. |
| 6,262,487 B1 | 7/2001 | Igarashi et al. |
| 6,263,475 B1 | 7/2001 | Toyonaga et al. |
| 6,282,693 B1 | 8/2001 | Naylor et al. |
| 6,301,686 B1 | 10/2001 | Kikuchi et al. |
| 6,301,693 B1 | 10/2001 | Naylor et al. |
| 6,307,256 B1 | 10/2001 | Chiang et al. |
| 6,316,838 B1 | 11/2001 | Ozawa et al. |
| 6,323,097 B1 | 11/2001 | Wu et al. |
| 6,324,674 B2 | 11/2001 | Andreev et al. |
| 6,324,675 B1 | 11/2001 | Dutta et al. |
| 6,349,403 B1 | 2/2002 | Dutta et al. |
| 6,408,427 B1 | 6/2002 | Cong et al. |
| 6,412,097 B1 | 6/2002 | Kikuchi et al. |
| 6,448,591 B1 | 9/2002 | Juengling |
| 6,480,993 B1 | 11/2002 | Suto et al. |
| 6,480,996 B1 | 11/2002 | Aji et al. |
| 6,507,941 B1 | 1/2003 | Leung et al. |
| 6,510,545 B1 | 1/2003 | Yee et al. |
| 6,516,455 B1 | 2/2003 | Teig et al. |
| 6,526,555 B1 | 2/2003 | Teig et al. |
| 6,543,043 B1 | 4/2003 | Wang et al. |
| 6,564,366 B1 | 5/2003 | Marchenko et al. |
| 6,598,215 B2 | 7/2003 | Das et al. |
| 6,645,842 B2 | 11/2003 | Igarashi et al. |
| 6,662,348 B1 | 12/2003 | Naylor et al. |
| 6,671,859 B1 | 12/2003 | Naylor et al. |
| 6,711,727 B1 | 3/2004 | Teig et al. |
| 6,734,472 B2 | 5/2004 | Ho |
| 6,895,567 B1 | 5/2005 | Teig et al. |
| 7,065,729 B1 | 6/2006 | Chapman |
| 7,257,797 B1 | 8/2007 | Waller et al. |
| 7,802,208 B1 | 9/2010 | Waller et al. |
| 2001/0004763 A1 | 6/2001 | Kato |
| 2001/0009031 A1 | 7/2001 | Nitta et al. |
| 2002/0069397 A1 | 6/2002 | Teig et al. |
| 2003/0025205 A1 | 2/2003 | Shively |
| 2005/0273748 A1 | 12/2005 | Hetzel et al. |

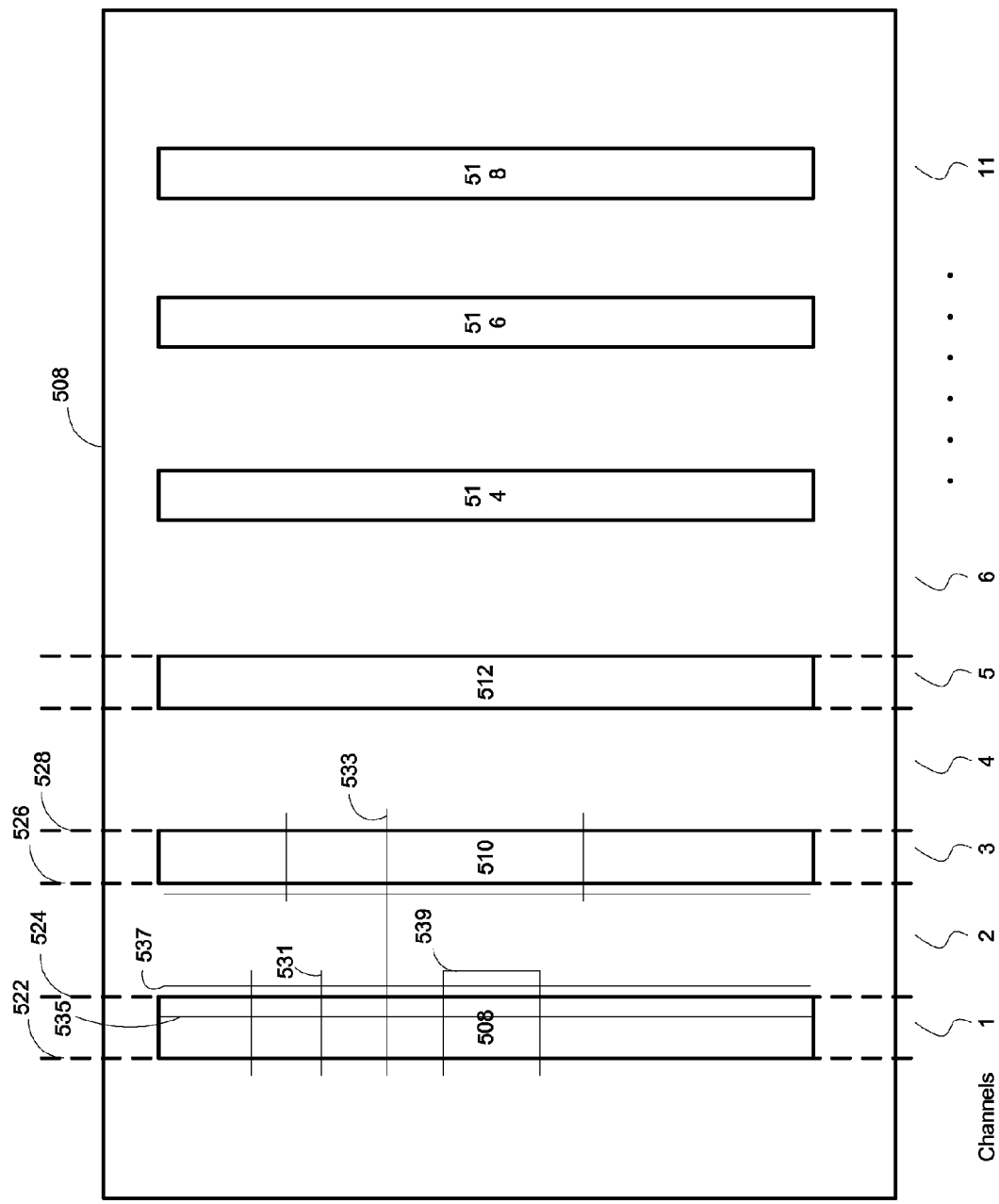

INTEGRATED CIRCUIT ROUTING WITH COMPACTION

CROSS-REFERENCE TO RELATED APPLICATIONS

This patent application is a continuation of U.S. patent application Ser. No. 13/186,258, filed Jul. 19, 2011, issued as U.S. Pat. No. 8,332,799 on Dec. 11, 2012, which is a continuation of Ser. No. 12/552,183, filed Sep. 1, 2009, issued as U.S. Pat. No. 7,984,411 on Jul. 19, 2011, which is a divisional of U.S. patent application Ser. No. 11/425,828, filed Jun. 22, 2006, issued as U.S. Pat. No. 7,603,644 on Oct. 13, 2009, which claims the benefit of U.S. provisional patent application 60/595,351, filed Jun. 24, 2005, which is incorporated by reference along with all other references cited in this application.

BACKGROUND OF THE INVENTION

The present invention relates to the field of electronic design automation for integrated circuits, and in particular, to an automatic routing and compaction technique for an integrated circuit layout.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed Internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire to for higher integration and better performance in integrated circuits.

Within an integrated circuit, there are devices, such as transistors, and interconnect. Interconnect is used to connect signals between the circuitry and also to supply power to the circuitry. Interconnect may include metal lines, polysilicon lines, polysilicide lines, or other conductive materials. Interconnect is also sometimes referred to as nets. There may be more than one layer of interconnect, such as metal-1 and metal-2 layers. There is a need for a technique of automatically routing the interconnect of an integrated circuit. Automatic routing will automatically connect the inputs of particular devices or circuits to the appropriate inputs, typically from other circuits or devices, or from the pins of those devices.

Therefore, there is a need for improved techniques in routing nets and compacting an integrated circuit layout.

BRIEF SUMMARY OF THE INVENTION

The invention provides a technique to automatically route nets and compact space of an integrated circuit design. After identifying cells rows and channel, which are gaps between the rows, the technique determines which nets should be routed in which areas. Spine routing is used for nets than span more than one row or channel. Alter the space between rows, larger or smaller, which will allow routing of the nets.

In an implementation, the invention is a method including identifying the cell rows and channels of an integrated circuit design; determining which nets of the integrated circuit design should be routed in which area, where routing of nets may be performed at least one of over the cell rows or in the channels between the rows; for the nets spanning more than one row or channel, routing a master spine in a normal direction to the row, thus coupling the row or channel spines together; and for each cell row and channel, routing the spines for the nets that have been assigned to that channel while ensuring that the row or channel spine, or both, reach the master spine and are connected by vias. In a specific embodiment, three layers of conductors such as metal may be used.

If there is insufficient space over the row, spines may be moved into one of the channels either side. The method may also evaluate each channel a balance of space. The method may include repeating routing the master spine, routing the spines for the nets, and evaluating for each channel the balance of space while increasing the width of channels with too little space and decreasing the width of channels with too much space, relative to the balance of space. When all channels can be routed but no longer decreased in size, the repeating step may be stopped. The channels for each net may be selected in order to minimize an amount of routing.

In another implementation, a method includes providing a layout with a first solid channel, a second solid channel, and a hollow channel between the first and second solid channels, where the first and second solid channels comprise cells that are to be routed; placing a first spine in normal direction in relation to the channels in the first solid channel; and attempting to place a second spine, orthogonal to the first spine, in the first solid channel. If there is no congestion in the first solid channel for the second spine, the second spine is placed in the same solid channel. If there is congestion in the first solid channel for the second spine, the second spine is placed in the hollow channel.

In another implementation, the invention is a space-based router system embodied using a computer-readable medium including: a first code component to identify solid and hollow channels in a selected portion of an integrated circuit layout; a second code component to automatically place route paths to connect pins of cells in the solid channels, where route paths may be placed within the solid channels or hollow channels; and a third component to reduce a width of at least one hollow channel when an entire space of the hollow channel is not occupied by a placed route path.

The third component to reduce a width of at least one hollow channel when an entire space of the hollow channel is not occupied by a placed route path is replaced by a fourth component to increase a width of at least one hollow channel when the hollow channel is not wide enough to accommodate a placed route path. The system may include a fourth code component to attempt to place a route path between two pins entirely within a solid channel before attempting to place a portion of a route path between the pins in a hollow channel, adjacent to the solid channel.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 5 shows an example of a layout where a compaction technique of the invention may be used.

DETAILED DESCRIPTION OF THE INVENTION

Figure 1:
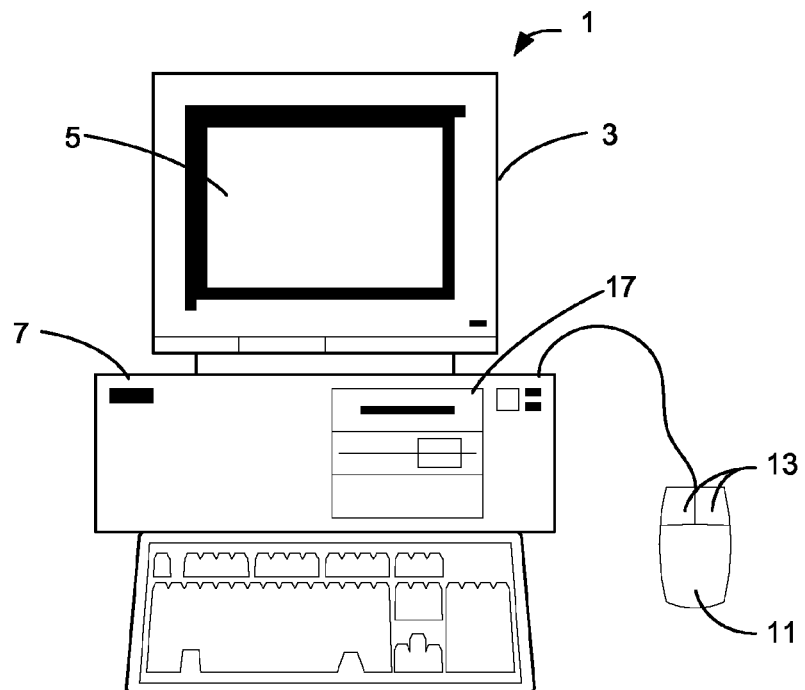
FIG. 1 shows a system of the present invention for performing electronic circuit design, including automatic routing of nets and compaction of space of an integrated circuit.

FIG. 1 shows an electronic design automation (EDA) system of the present invention for designing an electronic circuit or integrated circuit, including automatic routing of nets and compaction of space of the circuit. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like.

Mass storage devices 17 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 17. The source code of the software of the present invention may also be stored or reside on mass storage device 17 (e.g., hard disk, magnetic disk, tape, or CD-ROM). As a further example, code of the invention may be transmitted via wires, radio waves, or through a network such as the Internet.

Figure 2:
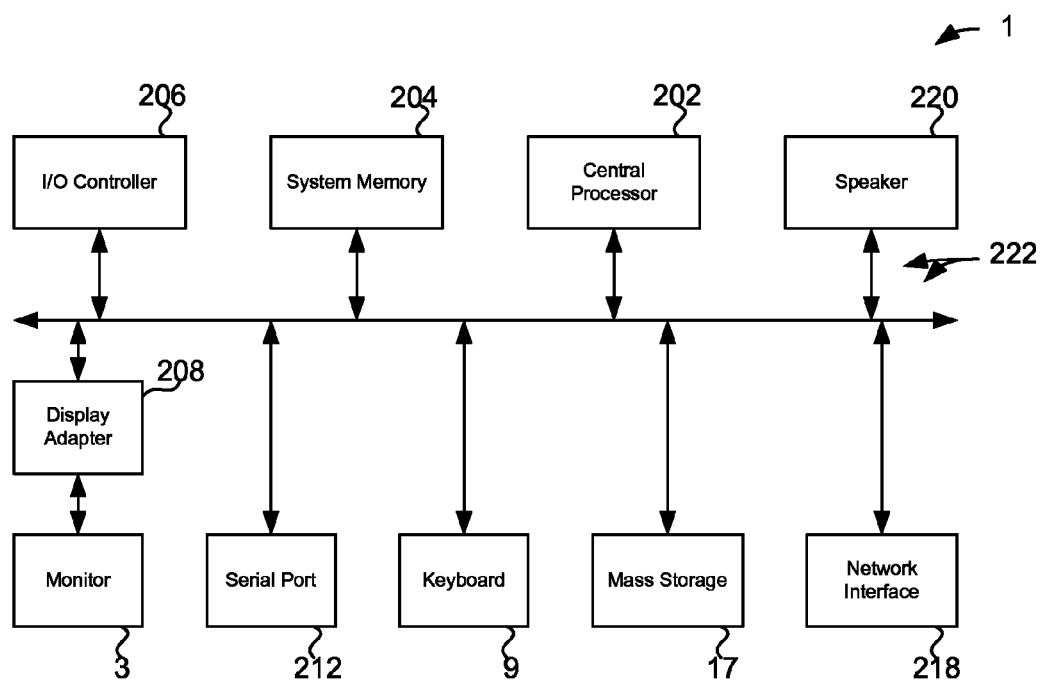
FIG. 2 shows a simplified system block diagram of computer system used in implementation of the present invention.

FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory. The processor may be a dual core or multicore processor, where there are multiple processor cores on a single integrated circuit. The system may also be part of a distributed computing environment.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www.mathworks.com), SAS, SPSS, Java, JavaScript, and AJAX. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP), Linux, HPUX, UNIX, or Sun OS. Other operating systems may be used. Other operating systems may be used. Other operating systems may be used. A computer in a distributed computing environment may use a different operating system from other computers.

Furthermore, the computer may be connected to a network and may interface to other computers using this network. For example, each computer in the network may perform part of the task of the many series of automatic routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

Figure 3:
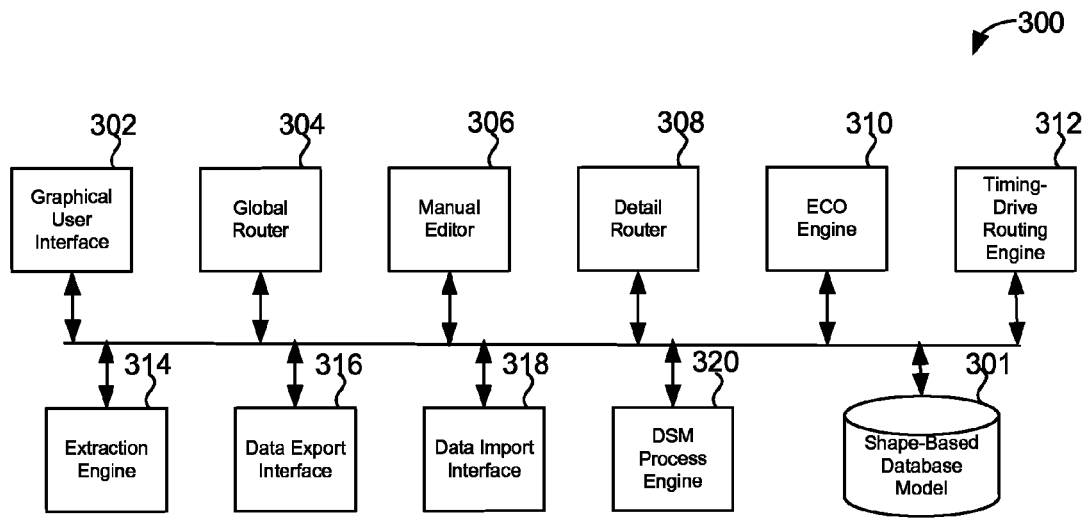
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change option (ECO) engine 310, timing-driven routing engine 312, extraction engine 314, data export interface 318, and DSM process engine 320. An EDA system may include any number of the system tools shown in FIG. 3, and in any combination. Further, the EDA system may include additional tools not shown in FIG. 3.

An EDA system may be a grid-based system or shape-based system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation.

The shape may be representative of any polygon. For example, the shape may be a rectangle. The shape may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used such as 30 degrees, 35 degrees, 36 degrees, 42 degrees, 45 degrees, or 60 degrees) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design.

The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques. Gridded systems are not good at irregular intervals, irregular spacings, or routing things that do not fit onto a regular grid.

The gridless approach easily handles off-grid connections and is efficient for post-route optimizations. In a shape-based or gridless system, the layout may be a gridless layout, which means there is no grid which structures or polygon of the layout are associated with, other than a grid for the relevant manufacturing process, if any.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

In FIG. 3, the EDA system 300 includes one or more of the components discussed below, in any combination. One skilled in the art will recognize that one or more of components shown in FIG. 3 may not be required to practice specific aspects of present invention. For example, when DSM process engine 320 is omitted from system, the system could still perform automatic routing of interconnect, but without providing DRC checking capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect.

A manual editor 306 is a shape-editing suite for creating or editing metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly close down troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect, and the detail router takes this routing information from the global router and puts in the physical detailed geometries of the tracks and vias.

An engineering change order (ECO) engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed. More details are discuss in U.S. patent application Ser. Nos. 10/709,843 and 10/709,844, both filed Jun. 1, 2004 and incorporated by reference.

In a specific embodiment, an RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool to which it is being exported.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include text, ASCII, GDSII, Verilog, SIF, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A user may design an integrated circuit using a system such as shown in FIG. 3. A representative flow for designing an integrated circuit is outlined in steps 1 to 8 below. Step 5 is further subdivided into three substeps.

Integrated Circuit Design Flow
 1. Provide Circuit Specification
 2. Create Circuit Design
 3. Generate Netlist
 4. Simulate Performance and Verify Functionality of Circuit Design
 5. Generate Layout
 5a. Layout Devices
 5b. Connect Devices
 5c. Connect Blocks of Circuitry
 6. Physical Verification and Design Checking
 7. Create Masks
 8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout can be back-annotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layers. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7). The masks are used to fabricate the integrated circuit (step 8) using a photolithography process. Typically, there are many "copies" of the same integrated circuited fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

Figure 4:
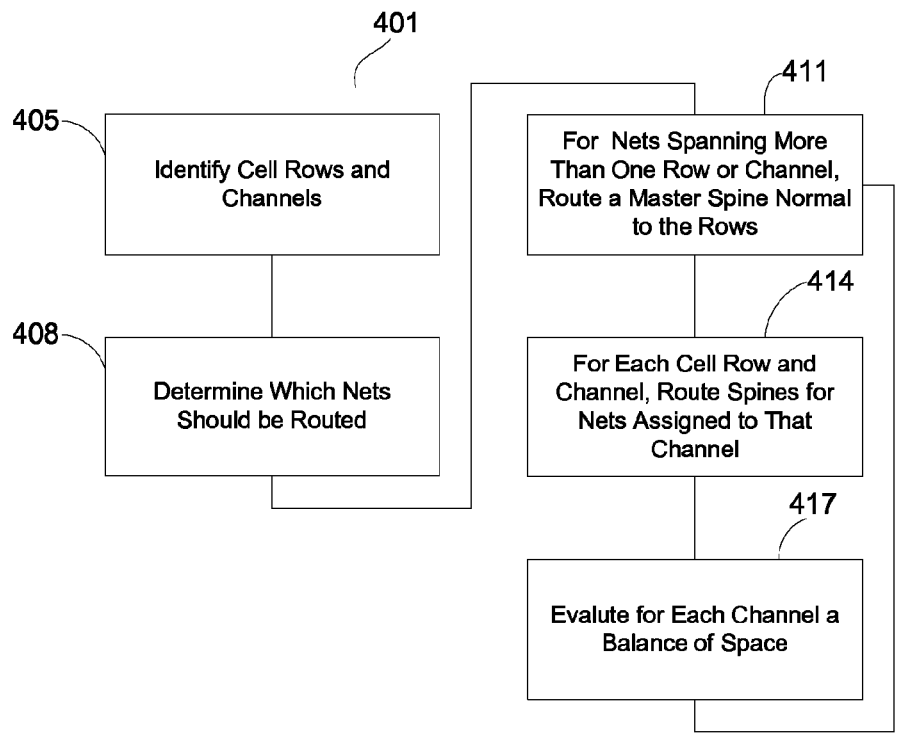
FIG. 4 shows a flow diagram of the invention.

FIG. 4 shows a flow diagram of a compaction technique of the invention. This flow 401 including steps 405, 408, 411, 414, and 417 is used to route and compact the layout of an integrated circuit. Routing connects the nets and compacting the layout decreases the size of the integrated circuit, which lowers the overall manufacturing cost of the integrated circuit. More dies can be made on a single silicon wafer and for a smaller die size, the yield of good dies will increase given the same defect density. The performance of the integrated circuit may also improve due to the smaller size. The flow of the invention may be used in a gridded or gridless system.

More specifically, in step 405 of the flow, the technique will identify solid channels (or cell rows) and hollow channels (i.e., the gaps between the rows) of an integrated circuit layout. In step 408, the technique will decide which nets should be routed in which area. Routing may be done both over the cell rows and in the hollow channels between the rows. Nets are allocated to channels in such a way as to minimize the number of channels used. For example, referring to FIG. 5, a net that has pins in solid channels 1, 3, 5, and 7, will be assigned to hollow channels 2 and 6; spines in channel 2 can feed the pins in 1 and 3; spines in channel 6 can feed the pins in 5 and 7. In step 411, for the nets that span more than channel, route a master spine in the normal direction to the rows. This is used to join the channel spines together.

Spine routing is discussed in U.S. provisional patent application 60/577,850, filed Jun. 7, 2004 and U.S. patent application Ser. No. 10/908,895, filed May 31, 2005, both of which are incorporated by reference along with all other references cited in this application.

In step 414, for each cell row and hollow channel, route the spines for the nets that have been assigned to that channel ensuring that the row or hollow channel spine, or both, reach the master spine and are connect by a via. If there is insufficient space for all the spines of nets assigned to a solid channel, the excess nets are re-assigned to one of the hollow channels on either. In step 417, evaluate for each channel the balance of space, i.e., extra space not required or too little space. Repeat steps 411, 414, and 417. However this time, increase the space in rows with too little and decrease the space in row with too much. When all channels can be routed but no longer decreased in size then stop.

If there is insufficient space overall then the available space is adjusted to give the best overall result by evening out the number of fails across the design. The normal shape-based router will have a better chance of finishing any remaining connections if the congestion is evenly spaced.

If there is too much space and the user has chosen not to compact but just to optimize then the extra space is evenly distributed amongst the rows.

If there are fixed rows or obstacles that stop the rows from moving then these should be taken into account.

Further, the following is an outline of a general operation of the invention.

1. In a specific embodiment of the invention, the user will use an application to floor plan and place their design leaving a gap between the rows of cells in the design. These gaps essentially constitute a number of parallel channels. This placement is not the final one in terms of size but will be used a template for the subsequent steps. The cells will be placed in the correct rows and the rows will be of the correct length but the gaps between the rows will at this stage by uniformly spread and not final, but merely a guess.

2. Then an identify channels tool that will automatically identify these channels and create a routing area for each channel. It will also create single channel covering the entire area in the opposite bias.

3. Another tool (or possibly the same one) will then decide for each net to be routed which channels it should be routed through. It will record this information in a net channel list attribute.

4. The next step will be the running of the channel routing tool. This will route all channels and all nets. So the design should now be routed to the extent that each pin has a spine either in its own (solid) channel, or in an adjacent (hollow) channel. What happens if the design is not fully routed is not is covered in the next step.

5. Then the results of the channel router are analyzed by an application and those channels with insufficient space will be widened and those with extra space will be made smaller. The application will move the placement rows and the cells to do this. This is possible because the application now understands the complete problem including the detailed floor plan, placement and routing.

6. Steps 4 and 5 will be repeated until an optimally sized and routed design is achieved.

Many of the above steps may be integrated into a single tool that can be run without user intervention. Of course the user can stop the tool and interject whenever appropriate.

Current placement and routing approaches are generally fixed size approaches were the user decides in advance how much space is required and then the router is constrained to route with the given space.

One approach is of the fixed size variety. It has the advantage that it usually results in a smaller overall design size but has the disadvantage that to each, the best results take several iterations. The gap between the rows is generally uniform to start with and the user has to manually adjust them to achieve the maximum density. Typically the gaps towards the center of the design should be much wider than those at the edges.

An embodiment of the invention provides a hybrid approach where the routing tool works on an initial fixed size proved by the user but is free to perform the time-consuming gap-size optimization for its self. Several other techniques will be used to ensure that the tools do not just grab a load of space to complete the routing and that a design of optimum size is achieved. For example the tool maybe constrained to the initial design size proved by the user and only allowed to change the distribution of available space (or make it smaller).

This tool can consider advanced constraints including placement weighting, placement clustering, bus routing, shielding and other signal integrity considerations, infinite control of routing widths and spacing, length constraints, matching, DFM rules, double vias, and others. This should result in not only smaller design, but much faster design closure.

FIG. 5 shows a layout of integrated circuit for which the compaction technique of the invention may be applied. The user will specify a region or area 508 of the layout for compaction. In this example, area 508 is selected using a rectangle shape or bounding box. However, in other embodiments of the invention, the area may be selected using other shapes, such as a square or trapezoid.

Within the area selected for compaction, there are cell regions 508, 510, 512, 514, 516, and 518. The cell regions are placed in placement rows, vertical rows in this case. These cell regions typically include numerous cells of circuitry that have pins, which will be connected using an automatic router. The automatic router may use a spine routing approach.

The compaction technique identifies channels. In this figure, there are channels 1 to 11. In a given layout, there can be any number of channels. There may be more than eleven channels or less than eleven channels. There may be even tens or hundreds of channels in a layout. The channels may be classified as solid channels or hollow channels. Solid channels include cell rows, while hollow channels are gaps or spaces between the rows of cells. Examples of solid channels are channels 1, 3, and 5. Examples of hollow channels are 2, 4, and 6. Abutting cell rows are treated as a single solid channel.

A goal of the technique of the invention is to optimize a width of the channel, so that the widths are no wider than needed to accommodate the routing of signals. Initially, the channels may be made wider than necessary to ensure routing of all the signals. Then, the compaction technique reduces the widths of channels to reduce wasted space. The compaction technique may also include techniques to widen some channels as needed to accommodate interconnect for routing.

To widen a specific hollow channel, a technique is to move one of the adjacent solid channel in a direction away from the other adjacent solid channel. Another technique is to move both adjacent solid channels in directions away from each other.

To narrow a specific hollow channel, a technique is to move one of the adjacent solid channel in a direction toward the other adjacent solid channel. Another technique is to move both adjacent solid channels in directions toward each other.

In one embodiment, a user may specify the channels within the compaction area. In another embodiment, an automated technique may be used to determine where the channels are. For example, to find the channels, the technique may search for cell regions and to put boundary lines at the cell boundaries, such as indicated by lines 522, 524, 526, and 528. Inside the cell region boundaries, such as the region between 522 and 524, will be the solid channels. Outside of the cell region boundaries, such as the region between 524 and 526, will be the hollow channels.

When performing spine routing for the cells, one or more master spines 531 are placed that runs normal to the cell row. These master spines may span multiple hollow and solid channels. For example, master spine 533 is an example of a spine that runs across two solid channels. These will be connected to using stitch layer spines which run parallel to the rows. These stitch layer spines may be placed within the cell rows, such as spine 535. Or the stitch layer spines may be placed within the hollow channels, such as spine 537. Generally, it is desirable to use stitch spines within the cell rows rather than in the hollow channels because then the hollow channels may be compacted by moving one or the other cell rows, or both, closer together.

When there is not enough space for a stitch spine within the cell row, then stitch spines to the right or left of the cell row will be used. For example, for channel 3, the technique may try to place a stitch spine within channel 3, but if space is not available, the technique will try to place the stitch spin in channel 2 or channel 4. Spine 539 shows an example of a connection outside the cell row to master spines.

When routing, if space is not available in a solid channel, then the hollow channels to the left and right are checked. For example, if space in channel 3, is not available (i.e., congestion), then channel 2 is checked first then channel 4, or vice versa. If space is not available also in 2 and 4, then the technique may widen the hollow channel 2 or channel 4 to allow placement of another spine.

Therefore, the technique of the invention can compact or shrink gaps between cell rows as much as possible, but also increase the gap as needed to ensure routing of the signals is possible. The invention allows compaction of a layout as much as possible while at the same time ensuring complete routability of the signals.

In the technique of the invention, routing includes placing master or main spines, and placing of stitch or secondary spines. If there is congestion for the stitch spines in the hollow channels, widen the hollow channels to accommodate as many stitch spines as needed. If there is no congestion in hollow channels, then shrink or make the hollow channels narrower. If there is congestion in a solid channel, reassign the stitch spine to a hollow channel. For example, if a solid channel can fit up to eight stitch spines and there are ten spines to place, then two spines will be placed in an adjacent hollow channel.

Further, for handling the assignment of stitch spines, for a situation when there are nets, not previously assigned, on two adjacent channels, the technique may assign stitch spine to hollow channel between solid channels. This makes the layout more compact since using two stitch spines within the two solid channels will not occur. Only a single stitch spine in the hollow channel will be used. If there are not nets, not previously assigned, on two adjacent solid channels, then assign the stitch spines to the solid channel, taking one net at a time.

When there is congestion in a hollow channel, the technique can widen the hollow channel to accommodate more stitch spines. According to on approach, if there is congestion by for example, five lines (via widths), increase the hollow channel by a ratio of number failed divided by number succeeded. So if one line failed and three succeeded, then increase the hollow channel by ⅓.

When there is slack (i.e., extra space) in a hollow channel, the technique can halve a width of the channel for the next iteration of assigning spines. The technique can remember the last width where there was no congestion.

A technique of the invention may include any combination of the techniques and approaches discussed above, increasing and decreasing widths of the hollow or solid channels, or both. The technique may also include automatically shrinking the die size based on extra space left over.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. An integrated circuit router system embodied using a nontransitory computer-readable medium comprising:
   a first code component to identify solid and hollow channels in a selected portion of an integrated circuit layout;
   a second code component to automatically place route paths to connect pins of cells in the solid channels, where route paths may be placed within the solid channels or hollow channels; and
   a third code component to form a first automatically placed route path comprising automatically coupling a first master stitch spine to a first stitch layer spine in a first hollow channel, on a first side of a first solid channel, to a second stitch layer spine in a second hollow channel, on a second side of the first solid channel, wherein the master stitch spine is transverse to the first and second stitch layer spines.

2. The system of claim 1 wherein the first master stitch spine passes through the first solid channel.

3. The system of claim 1 wherein the first master stitch spine is transverse to the first solid channel, first hollow channel, and second hollow channel.

4. The system of claim 1 wherein the first master stitch spine passes through a second solid channel, and the second hollow channel is between the first and second solid channels.

5. The system of claim 1 comprising:
   a fourth code component to form a second automatically placed route path comprising automatically coupling a second master stitch spine to a third stitch layer spine in the first solid channel, wherein the first and second master stitch spines pass through the first solid channel, and the third stitch layer spine is transverse to the second master stitch spine.

6. The system of claim 1 wherein the first automatically placed route path comprises a second master stitch spine to a third stitch layer spine in the first hollow channel.

7. An integrated circuit router system embodied using a nontransitory computer-readable medium comprising:
   a first code component to identify solid and hollow channels in a selected portion of an integrated circuit layout;
   a second code component to automatically place route paths to connect pins of cells in the solid channels, where route paths may be placed within the solid channels or hollow channels; and
   a third code component to form a first automatically placed route path comprising automatically coupling a first master stitch spine to a first stitch layer spine in a first hollow channel, wherein the first hollow channel is between a first solid channel and a second solid channel, and the first master stitch spine passes through the first and second solid channels.

8. The system of claim 7 wherein the first automatically placed route path comprises a second stitch layer spine in a second hollow channel adjacent to the second solid channel.

9. The system of claim 7 wherein the first automatically placed route path comprises a second stitch layer spine in the first solid channel.

10. The system of claim 7 comprising:
    a fourth code component to form a second automatically placed route path comprising automatically coupling a second master stitch spine to a second stitch layer spine in the first solid channel, wherein the first and second master stitch spines pass through the first solid channel, and the second stitch layer spine is transverse to the second master stitch spine.

11. The system of claim 7 comprising:
    a fourth code component to form a second automatically placed route path comprising automatically coupling a second master stitch spine to the first stitch layer spine, wherein the second master stitch spine passes through the first solid channel, but not the second solid channel.

12. The system of claim 7 comprising:
    a fourth code component to form a second automatically placed route path comprising automatically coupling a second master stitch spine and a third master stitch spine to a second stitch layer spine, wherein the second and third master stitch spines pass through the first solid channel, but not the second solid channel.

13. The system of claim 7 comprising:
    a fourth code component to form a second automatically placed route path comprising automatically coupling a second master stitch spine to a second stitch layer spine in the first hollow channel, wherein the second master stitch spine passes through the second solid channel, but not the first solid channel.

14. An integrated circuit router system embodied using a nontransitory computer-readable medium comprising:
- a first code component to identify solid and hollow channels in a selected portion of an integrated circuit layout;
- a second code component to automatically place route paths to connect pins of cells in the solid channels, where route paths may be placed within the solid channels or hollow channels; and
- a third code component to form a first automatically placed route path comprising automatically coupling a first master stitch spine to a first stitch layer spine in a first hollow channel, wherein the first hollow channel is between a first solid channel and a second solid channel, and the first master stitch spine passes through the first solid channel and not the second solid channel.

15. The system of claim 14 comprising:
- a fourth code component to form a second automatically placed route path comprising automatically coupling a second master stitch spine to a second stitch layer spine in the first hollow channel, wherein the second master stitch spine passes through the second solid channel and not the first solid channel.

16. The system of claim 14 comprising:
- a fourth code component to form a second automatically placed route path comprising automatically coupling a second master stitch spine to a second stitch layer spine in the first hollow channel, wherein the second master stitch spine passes through the first and second solid channels.

17. The system of claim 14 wherein the first automatically placed route path comprises a second master stitch spine that passes through the first solid channel and not the second solid channel.

18. The system of claim 14 wherein the first automatically placed route path comprises a second stitch layer spine in the first solid channel, and the second stitch layer spine is transverse to the first master stitch spine.

19. The system of claim 14 wherein the first master stitch spine is transverse to the first hollow channel, first solid channel, second solid channel, and the first stitch layer spine.

20. The system of claim 14 comprising:
- a fourth code component to form a second automatically placed route path comprising automatically coupling a second master stitch spine to a second stitch layer spine in the first solid channel, wherein the second master stitch spine passes through the first solid channel and not the second solid channel.

* * * * *